US012811104B2

(12) United States Patent
Koshimizu et al.

(10) Patent No.: US 12,811,104 B2
(45) Date of Patent: Nov. 24, 2026

(54) PLASMA PROCESSING APPARATUS

(71) Applicant: Tokyo Electron Limited, Tokyo (JP)

(72) Inventors: Chishio Koshimizu, Miyagi (JP); Junji Ishibashi, Miyagi (JP); Fumiaki Ariyoshi, Miyagi (JP); Sho Hakozaki, Miyagi (JP); Fumitoshi Kumagai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1057 days.

(21) Appl. No.: 17/940,508

(22) Filed: Sep. 8, 2022

(65) Prior Publication Data

US 2023/0077143 A1 Mar. 9, 2023

(30) Foreign Application Priority Data

Sep. 8, 2021 (JP) ................................ 2021-145970
Nov. 29, 2021 (JP) ................................ 2021-193070
Jun. 30, 2022 (JP) ................................ 2022-106117

(51) Int. Cl.
*H01L 21/306* (2006.01)
*H01J 37/32* (2006.01)

(52) U.S. Cl.
CPC .... *H01J 37/3244* (2013.01); *H01J 37/32091* (2013.01); *H01J 37/32128* (2013.01);
(Continued)

(58) Field of Classification Search
CPC ............. H01J 37/32091; H01J 37/3244; H01J 37/32532; H01J 37/32541; H01J 37/3255;
(Continued)

(56) References Cited

U.S. PATENT DOCUMENTS 4,854,263 A * 8/1989 Chang .................. C23C 16/345 118/728
2005/0269292 A1* 12/2005 Koshiishi .......... H01J 37/32449 156/345.47

(Continued)

FOREIGN PATENT DOCUMENTS

JP 2006-286813 A 10/2006
JP 2009-117711 A 5/2009

(Continued)

*Primary Examiner* — Luz L Alejandro Mulero
(74) *Attorney, Agent, or Firm* — XSENSUS LLP

(57) ABSTRACT

A plasma processing apparatus disclosed herein includes a chamber, a substrate support, an upper electrode, and at least one power supply. The chamber provides a processing space therein. The substrate support is provided in the chamber. The upper electrode configures a shower head that introduces a gas into the processing space from above the processing space. The upper electrode includes a first electrode and a second electrode. The first electrode provides a plurality of first gas holes opened toward the processing space. The second electrode is provided directly or indirectly on the first electrode and provides a plurality of second gas holes communicating with the plurality of first gas holes. The at least one power supply is configured to set a potential of the second electrode to a potential higher than a potential of the first electrode.

14 Claims, 16 Drawing Sheets

(52) U.S. Cl.
CPC .. *H01J 37/32137* (2013.01); *H01J 37/32174* (2013.01); *H01J 37/32522* (2013.01); *H01J 37/32541* (2013.01)

(58) Field of Classification Search
CPC ........... H01J 37/32559; H01J 37/32568; H01J 37/32577; H01J 37/32587; H01J 37/32128; H01J 37/32137; H01J 37/32174
See application file for complete search history.

(56) References Cited

U.S. PATENT DOCUMENTS

| | | | | | |
|---|---|---|---|---|---|
| 2006/0219363 | A1* | 10/2006 | Matsumoto | C23F 4/00 | 156/345.47 |
| 2006/0228496 | A1* | 10/2006 | Choi | H01J 37/3244 | 118/715 |
| 2007/0084562 | A1* | 4/2007 | Tsujimoto | H01J 37/32862 | 156/345.24 |
| 2009/0197423 | A1* | 8/2009 | Koshimizu | H10P 72/0434 | 438/719 |
| 2011/0265721 | A1* | 11/2011 | Kao | H01J 37/3244 | 422/186.04 |
| 2013/0105303 | A1* | 5/2013 | Lubomirsky | H01J 37/32091 | 204/192.34 |

FOREIGN PATENT DOCUMENTS

| | | | |
|---|---|---|---|
| JP | 2012-216607 | A | 11/2012 |
| KR | 10-20060105670 | A | 10/2006 |
| KR | 10-20120112218 | A | 10/2012 |
| KR | 10-20190117247 | A | 10/2019 |

* cited by examiner

PLASMA PROCESSING APPARATUS

CROSS-REFERENCE TO RELATED APPLICATIONS

This application claims priority to Japanese Patent Application Nos. 2022-106117 filed on Jun. 30, 2022, 2021-193070 filed on Nov. 29, 2021, and 2021-145970 filed on Sep. 8, 2021, the entire contents of which are incorporated herein by references.

TECHNICAL FIELD

Exemplary embodiments of the present disclosure relate to a plasma processing apparatus.

BACKGROUND

In plasma processing on a substrate, a plasma processing apparatus is used. One type of the plasma processing apparatus includes a shower head. The shower head is provided above a substrate support provided in a chamber. The shower head provides a plurality of gas holes. In Japanese Patent Application Publication No. 2009-117711 described below, in order to suppress an abnormal discharge in the plurality of gas holes, gas grooves communicating with the plurality of gas holes are provided on a lower surface of the shower head.

Japanese Patent Application Publication No. 2009-117711

SUMMARY

The present disclosure provides a technique for suppressing gas dissociation in a plurality of gas holes of a shower head.

In an exemplary embodiment, a plasma processing apparatus is provided. The plasma processing apparatus includes a chamber, a substrate support, an upper electrode, and at least one power supply. The chamber provides a processing space therein. The substrate support is provided in the chamber. The upper electrode configures a shower head that introduces a gas into the processing space from above the processing space. The upper electrode includes a first electrode and a second electrode. The first electrode provides a plurality of first gas holes opened toward the processing space. The second electrode is provided directly or indirectly on the first electrode and provides a plurality of second gas holes communicating with the plurality of first gas holes. The at least one power supply is configured to set a potential of the second electrode to a potential higher than a potential of the first electrode.

According to an exemplary embodiment, it is possible to suppress the gas dissociation in the plurality of gas holes of the shower head.

DETAILED DESCRIPTION

Figure 1:
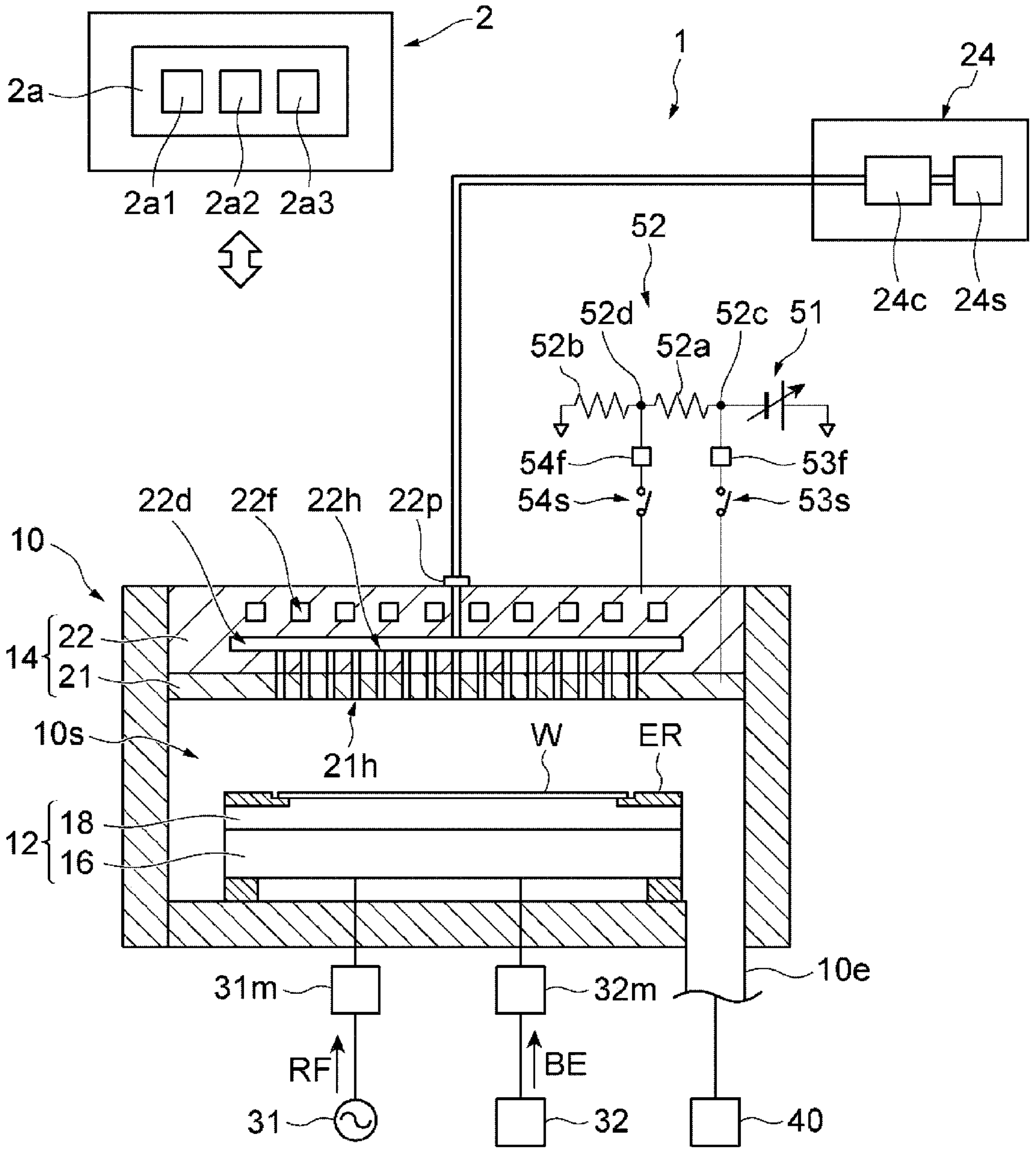
FIG. 1 is a diagram schematically showing a plasma processing apparatus according to an exemplary embodiment.

Hereinafter, various exemplary embodiments will be described in detail with reference to the drawings. Further, like reference numerals will be given to like or corresponding parts throughout the drawings.

FIG. 1 is a diagram schematically showing a plasma processing apparatus according to an exemplary embodiment. In an embodiment, a plasma processing system is provided as shown in FIG. 1. The plasma processing system includes a plasma processing apparatus 1. The plasma processing apparatus 1 may further include a controller 2.

The controller 2 processes a computer-executable command that causes the plasma processing apparatus 1 to execute various processes. The controller 2 may be configured to control each component of the plasma processing apparatus 1 so as to execute various processes. In an embodiment, part or all of the controller 2 may be included in the plasma processing apparatus 1. The controller 2 may include, for example, a computer 2*a*. For example, the computer 2*a* may include a processor (central processing unit (CPU)) 2*a*1, a storage 2*a*2, and a communication interface 2*a*3. The processor 2*a*1 may be configured to perform various control operations based on a program stored in the storage 2*a*2. The storage 2*a*2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

The plasma processing apparatus 1 is a capacitively-coupled plasma processing apparatus. The plasma processing apparatus 1 includes a chamber 10, a substrate support 12, and an upper electrode 14. The chamber 10 provides a processing space 10s therein. The chamber 10 has a substantially cylindrical shape. A sidewall of the chamber 10 is electrically grounded.

The plasma processing apparatus 1 may further include an exhaust system 40. The exhaust system 40 may be connected to a gas exhaust port 10e provided at a bottom of the chamber 10, for example. The exhaust system 40 may include a pressure adjusting valve and a vacuum pump. A pressure in the processing space 10s is adjusted by the pressure adjusting valve. The vacuum pump may include a turbo molecular pump, a dry pump, or a combination thereof.

The substrate support 12 is provided in the chamber 10. The substrate support 12 is configured to support a substrate W placed thereon. The substrate support 12 may be configured to further support an edge ring ER placed thereon. The substrate W is disposed in a region surrounded by the edge ring ER on the substrate support 12.

In an embodiment, the substrate support 12 may include a base 16 and an electrostatic chuck 18. The base 16 includes a conductive member. The conductive member of the base 16 functions as a lower electrode. The electrostatic chuck 18 is disposed on the base 16. The substrate W is placed on the electrostatic chuck 18. The electrostatic chuck 18 is configured to hold the substrate W by an electrostatic attraction.

The substrate support 12 may include a temperature control module configured to adjust at least one of the electrostatic chuck 18, the edge ring ER, or the substrate W to a target temperature. The temperature control module may include a heater, a heat transfer medium, a flow path, or a combination thereof. A heat medium such as brine or a gas flows through the flow path. Further, the substrate support 12 may further include a heat transfer gas supply configured to supply a heat transfer gas to a gap between a rear surface of the substrate W and the electrostatic chuck 18.

The plasma processing apparatus 1 may further include a radio-frequency power supply 31 and a bias power supply 32. The radio-frequency power supply 31 is configured to supply source radio-frequency power RF for generating plasma from the gas in the chamber 10. The source radio-frequency power RF has a frequency in a range of 13 MHz to 150 MHz. The radio-frequency power supply 31 is connected to a radio-frequency electrode via a matcher 31m. The matcher 31m includes a matching circuit that matches an impedance of a load of the radio-frequency power supply 31 with an output impedance of the radio-frequency power supply 31. The radio-frequency electrode may be an electrode of the substrate support 12, for example, the conductive member of the base 16. The radio-frequency electrode may be another electrode of the substrate support 12. Alternatively, the radio-frequency electrode may be the upper electrode 14.

The bias power supply 32 is electrically connected to a bias electrode (for example, conductive member of base 16) of the substrate support 12. The bias power supply 32 is configured to supply electric bias energy BE to the bias electrode of the substrate support 12 in order to attract ions from the plasma to the substrate W placed on the substrate support 12. The bias power supply 32 may be electrically connected to the electrode of the substrate support 12 different from the conductive member of the base 16.

The electric bias energy BE has a waveform cycle CY (refer to FIGS. 11 to 14) and is periodically supplied. The waveform cycle CY has a time length that is the reciprocal of a bias frequency. The bias frequency may be a frequency in a range of 100 kHz to 13.56 MHz.

Figure 11:
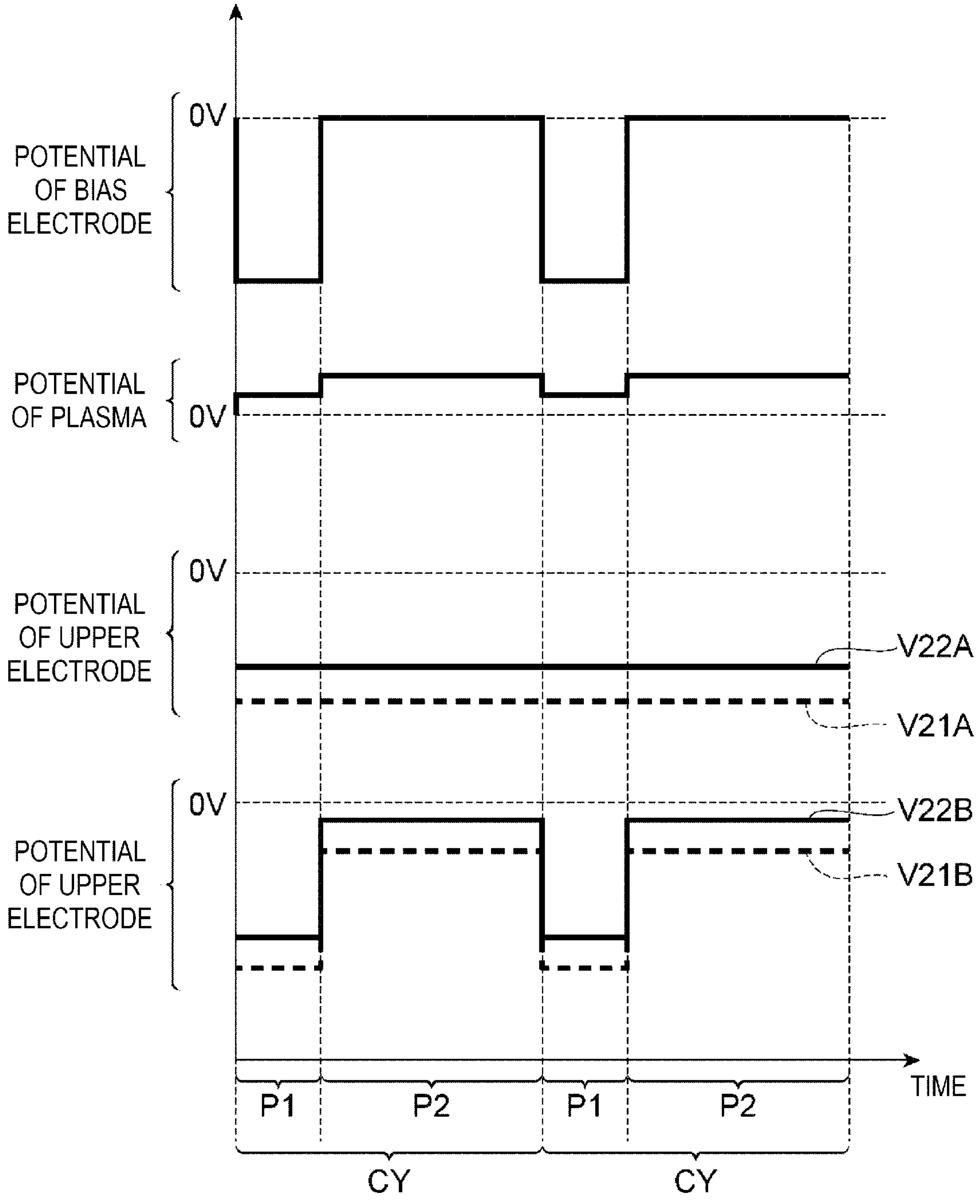
FIG. 11 is an exemplary timing chart.
Figure 12:
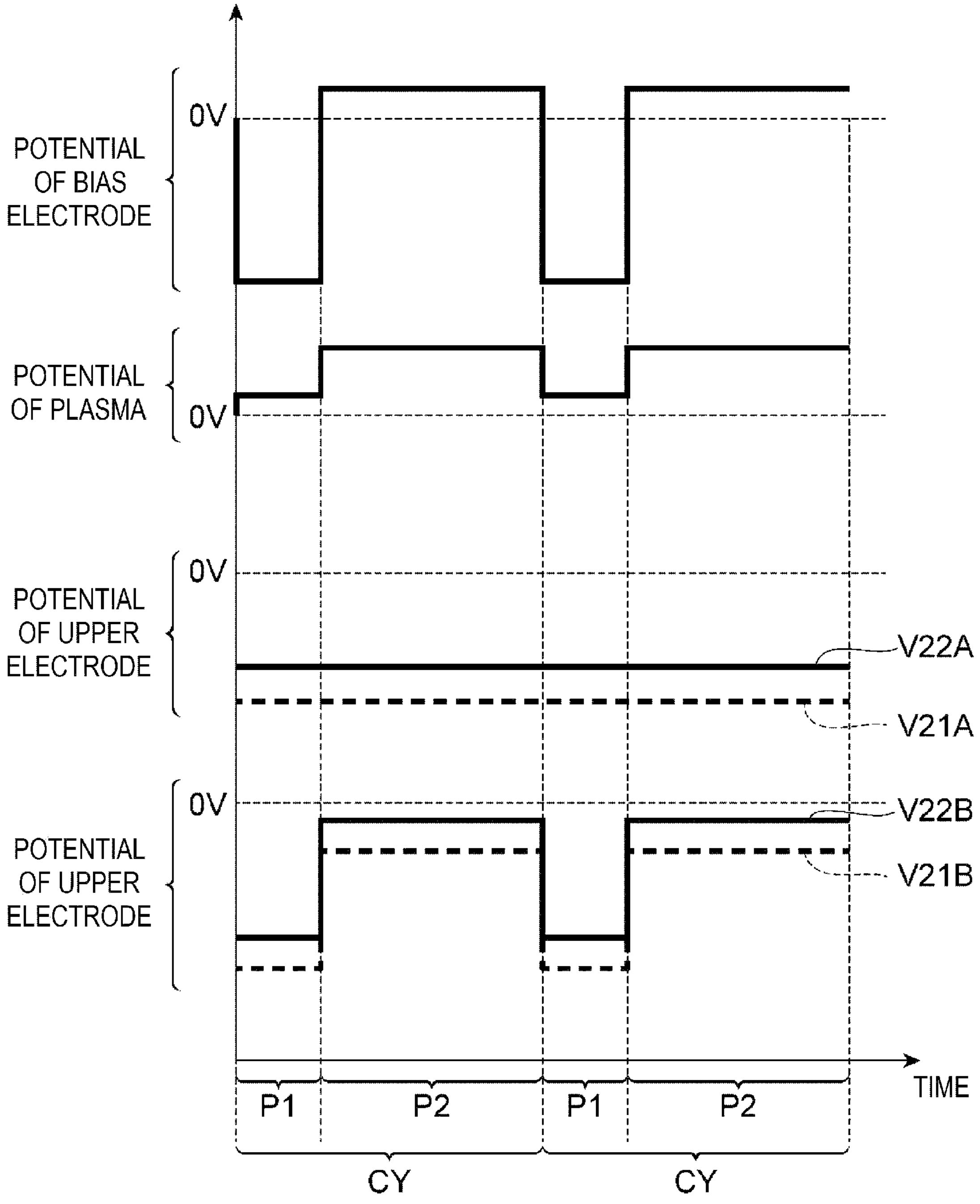
FIG. 12 is an exemplary timing chart.
Figure 13:
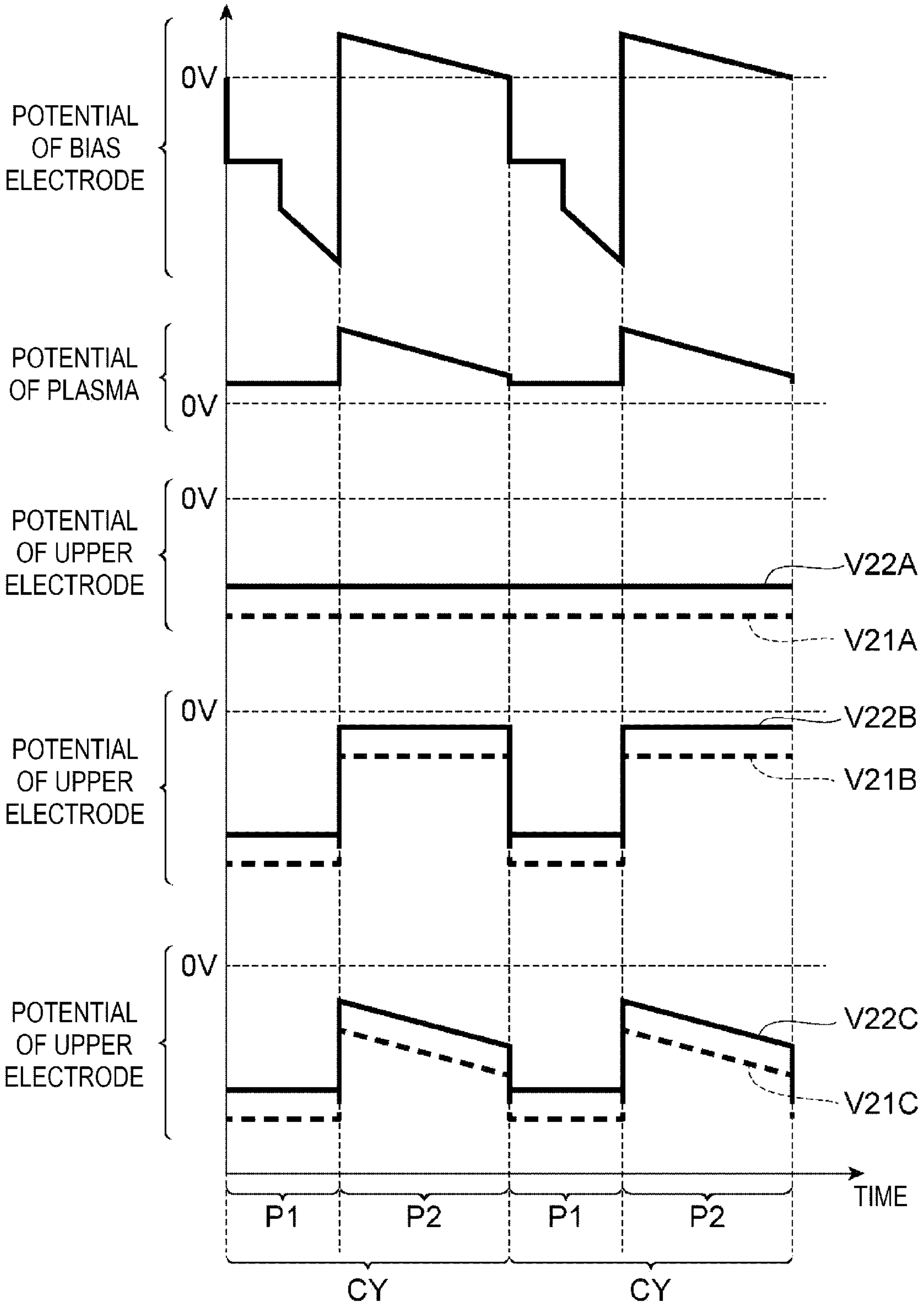
FIG. 13 is an exemplary timing chart.
Figure 14:
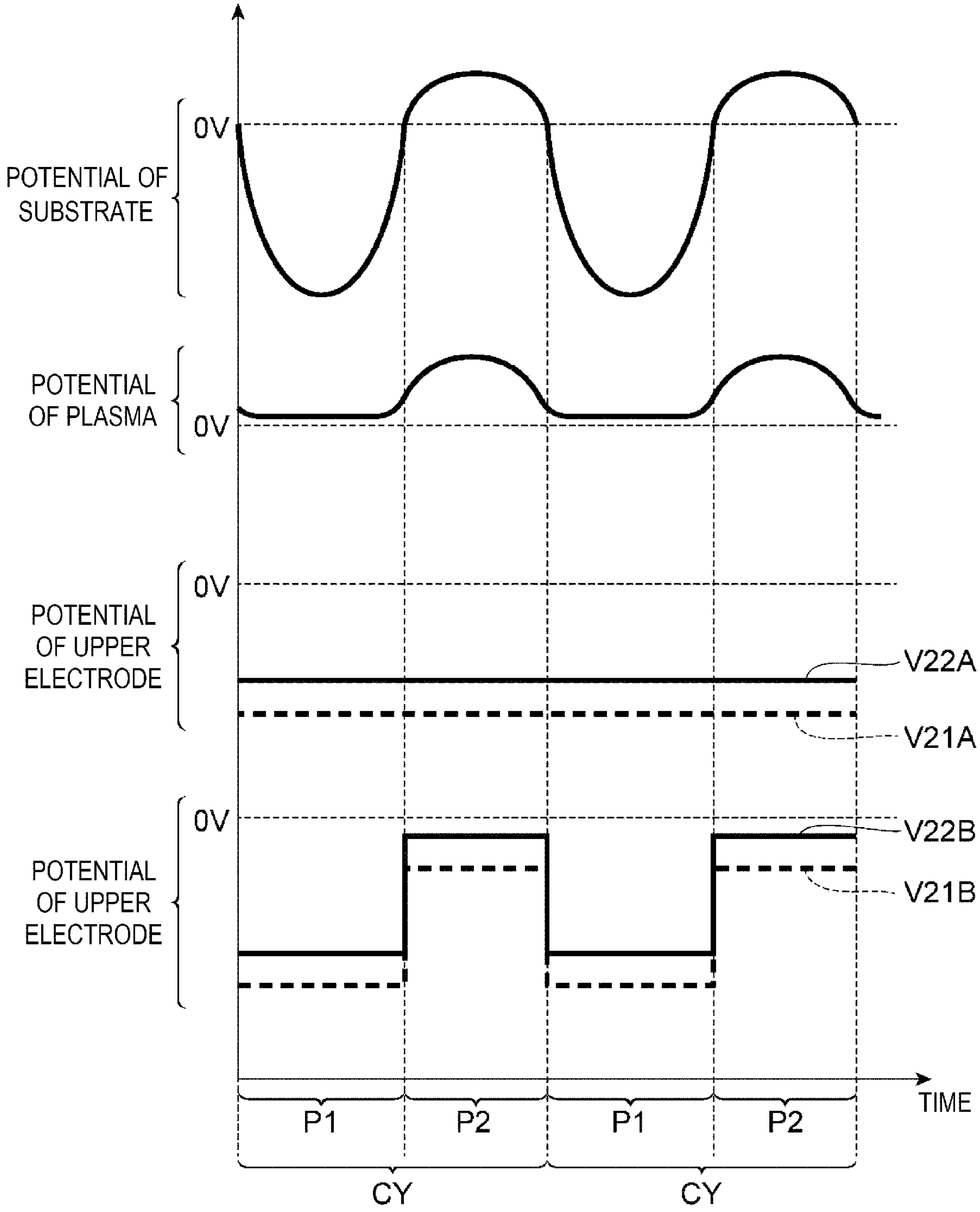
FIG. 14 is an exemplary timing chart.

The electric bias energy BE may include bias radio-frequency power (refer to, potential of substrate in FIG. 14) or a pulse of a voltage (refer to, potential of bias electrode in FIGS. 11 to 13). The bias radio-frequency power has the bias frequency. A waveform of the bias radio-frequency power is a sine wave having the bias frequency. When the electric bias energy BE is the bias radio-frequency power, the bias power supply 32 is connected to the bias electrode of the substrate support 12 via a matcher 32m. The matcher 32m includes a matching circuit that matches an impedance of a load of the bias power supply 32 with an output impedance of the bias power supply 32.

The pulse of the voltage is periodically generated in a time interval that is the reciprocal of the bias frequency. The pulse of the voltage may have a negative polarity. The pulse of the voltage may be a pulse of a voltage generated from a direct-current voltage. The pulse of the voltage may have any waveform such as a rectangular pulse wave, a triangular pulse wave, or an impulse wave.

Figure 2:
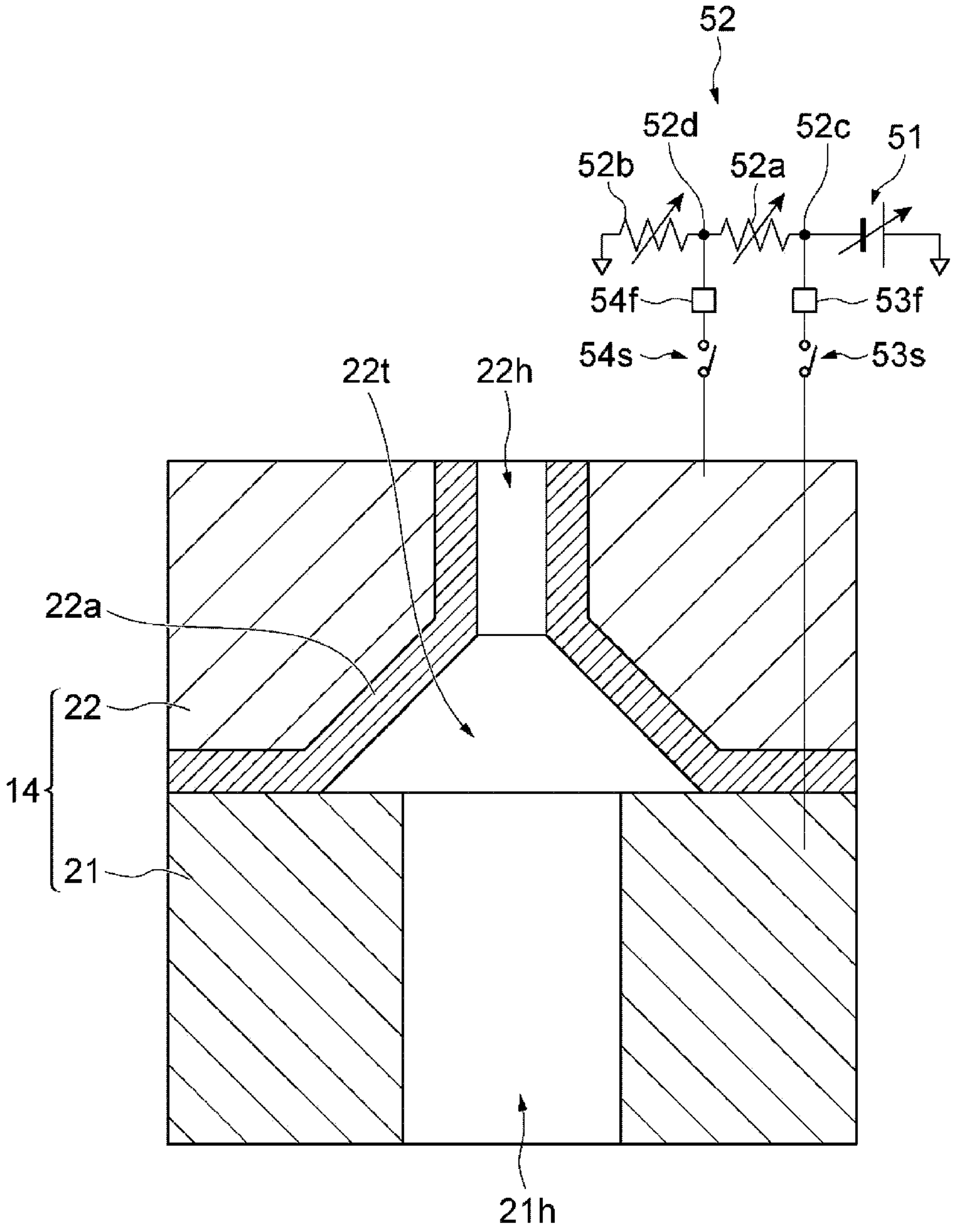
FIG. 2 is a partially enlarged cross-sectional view of an upper electrode of the plasma processing apparatus according to an exemplary embodiment.

Hereinafter, FIG. 2 will be referred to together with FIG. 1. FIG. 2 is a partially enlarged cross-sectional view of an upper electrode of the plasma processing apparatus according to an exemplary embodiment. The upper electrode 14 configures a shower head that introduces a gas from above the processing space 10s into the processing space 10s. The upper electrode 14 closes an upper end opening of the sidewall of the chamber 10 and defines the processing space 10s. The upper electrode 14 is electrically insulated from the sidewall of the chamber 10.

The upper electrode 14 includes a first electrode 21 and a second electrode 22. The first electrode 21 has a substantially disc shape. The first electrode 21 is made of, for example, silicon, silicon carbide, or quartz. A lower surface of the first electrode 21 is in contact with the processing space 10s. The first electrode 21 provides a plurality of first gas holes 21h. The plurality of first gas holes 21h penetrate the first electrode 21 in a plate thickness direction thereof and are opened toward the processing space 10s.

The second electrode 22 is provided directly on the first electrode 21. The second electrode 22 may be indirectly provided on the first electrode 21. The second electrode 22 has a substantially disc shape. The second electrode 22 is made of a metal such as aluminum or silicon carbide. A surface of the second electrode 22 may be configured of a film 22a. The film 22a has corrosion resistance and is, for example, an alumite film generated by anodization. The second electrode 22 provides a plurality of second gas holes 22h. The plurality of second gas holes 22h extend in a vertical direction and respectively communicate with the plurality of first gas holes 21h.

The second electrode 22 may further provide a gas diffusion chamber 22d and a gas introduction port 22p. The gas diffusion chamber 22d is provided in the second electrode 22. The plurality of second gas holes 22h extend downward from the gas diffusion chamber 22d. The gas introduction port 22p is connected to the gas diffusion chamber 22d. A gas supply 24 is connected to the gas introduction port 22p.

The gas supply 24 may include one or more gas sources 24s and one or more flow rate controllers 24c. The gas supply 24 is configured to supply one or more gases from respective corresponding gas sources 24*s* to the gas introduction port 22*p* via respective corresponding flow rate controllers 24*c*. The one or more gases supplied to the gas introduction port 22*p* are introduced into the chamber 10 via the gas diffusion chamber 22*d*, the plurality of second gas holes 22*h*, and the plurality of first gas holes 21*h*.

In an embodiment, an end portion 22*t* of each of the plurality of second gas holes 22*h* on a side of the first electrode 21 may have a tapered shape. That is, the end portion 22*t* of each of the plurality of second gas holes 22*h* on the side of the first electrode 21 may have a diameter that increases in response to a decrease in a distance from a corresponding first gas hole 21*h* in the vertical direction. In an embodiment, a diameter of an opening (lower end opening) of the end portion 22*t* is larger than a diameter of the corresponding first gas hole 21*h*. According to this embodiment, even when a misalignment occurs between each second gas hole 22*h* and a corresponding first gas hole 21*h* due to a difference in thermal expansion coefficients of the first electrode 21 and the second electrode 22, a state where each second gas hole 22*h* and the corresponding first gas hole 21*h* communicate with each other is maintained.

In an embodiment, the second electrode 22 may have a temperature control mechanism. The temperature control mechanism may include a flow path 22*f* formed in the second electrode 22. A supply device for supplying a heat medium (for example, coolant) is connected to the flow path 22*f*. The supply device is provided outside the chamber 10. The heat medium supplied from the supply device to the flow path 22*f* flows through the flow path 22*f* and is returned to the supply device. The temperature control mechanism of the second electrode 22 may include a heater in addition to the flow path 22*f*.

The plasma processing apparatus 1 further includes at least one power supply. The at least one power supply is configured to set a potential of the second electrode 22 to a potential higher than a potential of the first electrode 21. That is, the at least one power supply sets the potential of the second electrode 22 to the potential higher on a positive side than the potential of the first electrode 21. The potential of the first electrode 21 may be a negative potential, 0 V (ground potential), or floating. For example, the potential of the first electrode 21 may be a positive potential, and the potential of the second electrode 22 may be higher on the positive side than the potential of the first electrode 21. Alternatively, the potential of the first electrode 21 may be 0 V, and the potential of the second electrode 22 may be a positive potential. Alternatively, the potential of the first electrode 21 may be the negative potential, and the potential of the second electrode 22 may be 0 V. Alternatively, the potential of the first electrode 21 may be a negative potential, and the potential of the second electrode 22 may be a negative potential higher on the positive side than the potential of the first electrode 21.

In the embodiment shown in FIGS. 1 and 2, the plasma processing apparatus 1 includes a single direct-current power supply 51 as the at least one power supply and further includes a resistance dividing circuit 52. The direct-current power supply 51 may be a variable direct-current power supply. The positive terminal of the direct-current power source 51 is connected to the ground. A negative terminal of the direct-current power supply 51 is connected to one end of the resistance dividing circuit 52. Two nodes 52*c* and 52*d* having different potentials in the resistance dividing circuit 52 are electrically connected to the first electrode 21 and the second electrode 22, respectively.

In an embodiment, the resistance dividing circuit 52 includes a resistor 52*a* and a resistor 52*b*. One end of the resistor 52*a* is connected to the negative terminal of the direct-current power supply 51. The node 52*c* is provided on an electric path that connects one end of the resistor 52*a* and the negative terminal of the direct-current power supply 51 to each other and is electrically connected to the first electrode 21. The node 52*c* may be connected to the first electrode 21 via a filter 53*f* and a switch 53*s*. The filter 53*f* is a low-pass filter that blocks or attenuates radio-frequency power.

One end of the resistor 52*b* is electrically connected to the other end of the resistor 52*a*, and the other end of the resistor 52*b* is connected to the ground. The node 52*d* is provided on an electric path that connects one end of the resistor 52*b* and the other end of the resistor 52*a* to each other and is electrically connected to the second electrode 22. The node 52*d* may be connected to the second electrode 22 via a filter 54*f* and a switch 54*s*. The filter 54*f* is a low-pass filter that blocks or attenuates the radio-frequency power.

As shown in FIG. 1, the resistor 52*a* may be a fixed resistor. Alternatively, the resistor 52*a* may be a variable resistor, as shown in FIG. 2. When the resistor 52*a* is the variable resistor, it is possible to adjust a potential difference between the first electrode 21 and the second electrode 22. Further, the resistor 52*b* may be the fixed resistor or the variable resistor.

In the plasma processing apparatus 1 including the resistance dividing circuit 52, the potential of the first electrode 21 becomes the negative potential. The potential of the second electrode 22 is the negative potential and becomes the potential higher than the potential of the first electrode 21.

Figure 3A:
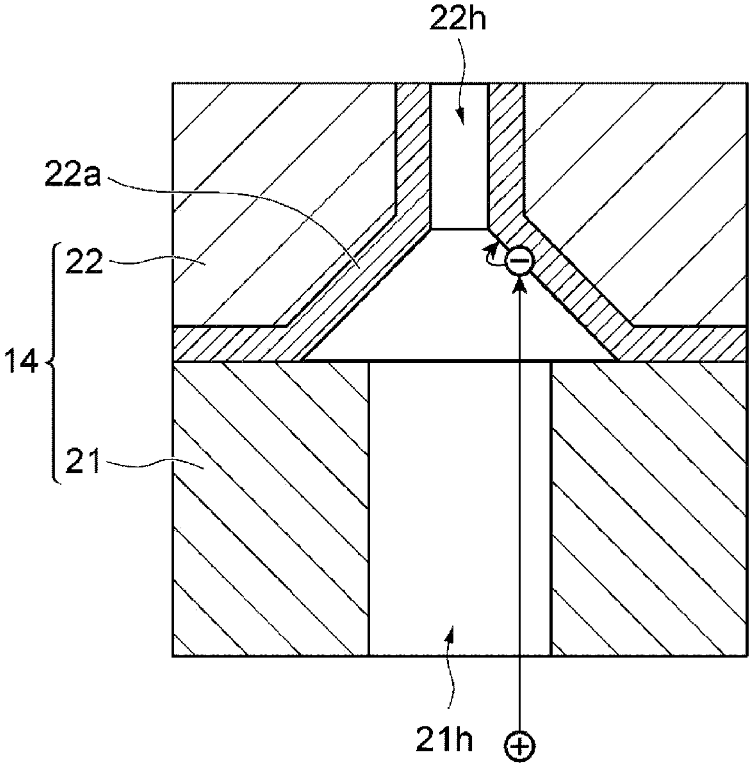
FIG. 3A is a diagram showing behavior of a secondary electron in the plasma processing apparatus according to an exemplary embodiment.
Figure 3B:
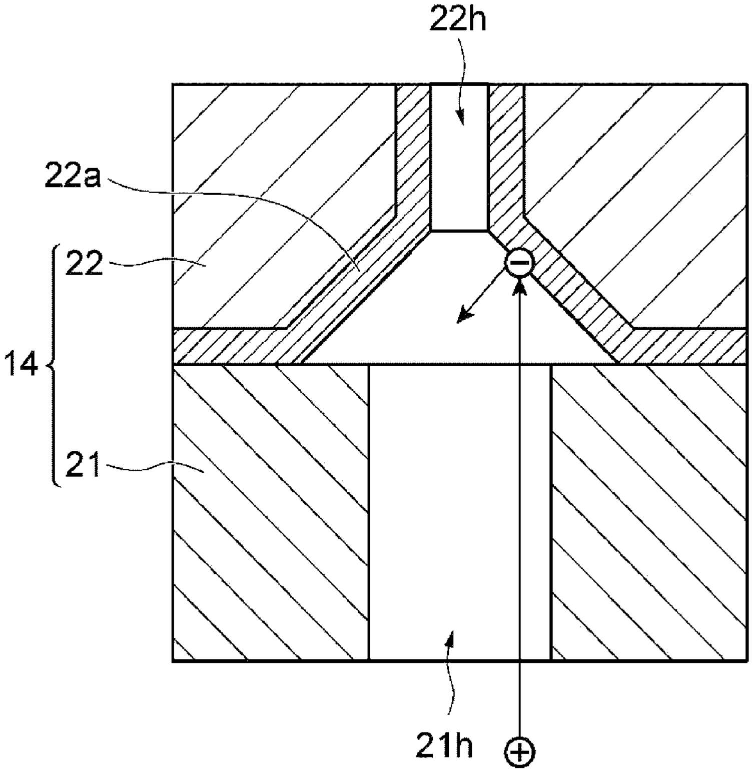
FIG. 3B is a diagram showing the behavior of the secondary electron when a potential of a first electrode and a potential of a second electrode are the same.

Hereinafter, reference will be made to FIGS. 3A and 3B. FIG. 3A is a diagram showing behavior of a secondary electron in the plasma processing apparatus according to an exemplary embodiment, and FIG. 3B is a diagram showing the behavior of the secondary electron when a potential of a first electrode and a potential of a second electrode are the same. In FIGS. 3A and 3B, a circle surrounding [+] indicates a positive ion, and a circle surrounding [−] indicates a secondary electron. In the plasma processing apparatus 1, the shower head provides a plurality of gas holes. Each of the plurality of gas holes includes one of the plurality of first gas holes 21*h* and a second gas hole 22*h* communicating therewith. When the potential of the first electrode 21 and the potential of the second electrode 22 are the same, positive ions enter the plurality of gas holes from the plasma and collide with the second electrode 22 and thus secondary electrons are generated, and a discharge may be generated by the secondary electron. On the other hand, in the plasma processing apparatus 1, the potential of the second electrode 22 is set to the potential higher than the potential of the first electrode 21. Therefore, in the plasma processing apparatus 1, even when the positive ions enter the plurality of gas holes from the plasma in the processing space 10*s* and collide with the second electrode 22 and thus the secondary electrons are emitted from the second electrode 22, the secondary electrons are immediately attracted to the second electrode 22. Therefore, dissociation of the gas in the plurality of gas holes by the colliding of the secondary electrons with the gas in the plurality of gas holes is suppressed.

In an embodiment, a difference between the potential of the second electrode 22 and the potential of the first electrode 21 may be 5 V or more. With this potential difference, the dissociation of the gas in the plurality of gas holes is more effectively suppressed.

Figure 4:
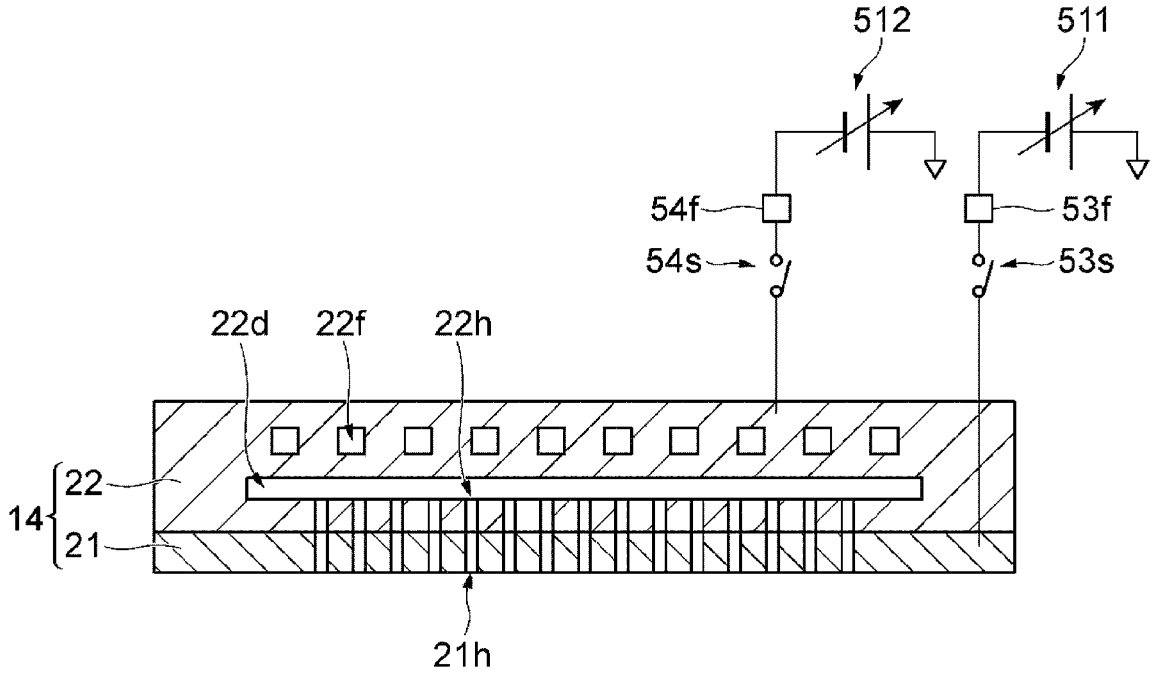
FIG. 4 is a diagram showing at least one power supply adopted in the plasma processing apparatus according to another exemplary embodiment.
Figure 5:
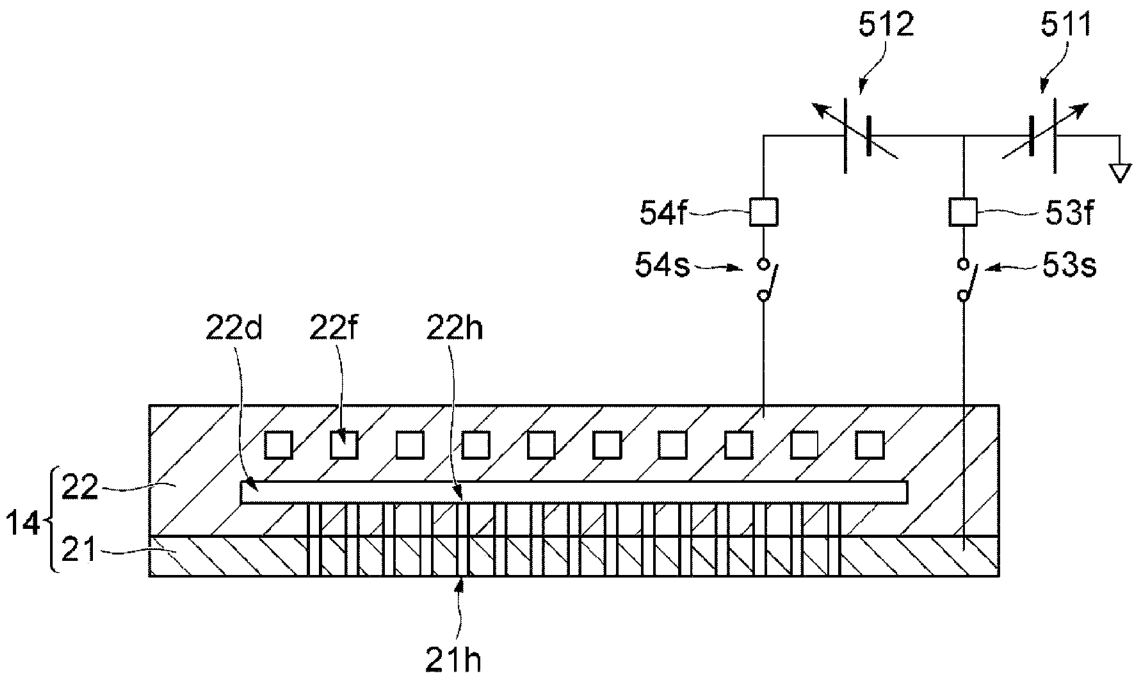
FIG. 5 is a diagram showing at least one power supply adopted in the plasma processing apparatus according to still another exemplary embodiment.

Hereinafter, reference will be made to FIGS. 4 and 5. FIG. 4 is a diagram showing at least one power supply adopted in the plasma processing apparatus according to another exemplary embodiment. FIG. 5 is a diagram showing at least one power supply adopted in the plasma processing apparatus according to still another exemplary embodiment. As shown in FIGS. 4 and 5, the plasma processing apparatus 1 may include a first power supply and a second power supply, that is, a direct-current power supply 511 and a direct-current power supply 512, as the at least one power supply. Each of the direct-current power supply 511 and the direct-current power supply 512 may be the variable direct-current power supply.

In the embodiment shown in FIG. 4, the positive terminal of the direct-current power supply 511 is connected to the ground. A negative terminal of the direct-current power supply 511 is connected to the first electrode 21 via the filter 53*f* and the switch 53*s*. The positive terminal of the direct-current power source 512 is connected to the ground. The negative terminal of the direct-current power supply 512 is connected to the second electrode 22 via the filter 54*f* and the switch 54*s*. In the embodiment shown in FIG. 4 as well, the potential of the first electrode 21 becomes the negative potential. Further, the potential of the second electrode 22 is also the negative potential. The potential of the second electrode 22 is set to the potential higher than the potential of the first electrode 21.

In the embodiment shown in FIG. 5, the positive terminal of the direct-current power supply 511 is connected to the ground. A negative terminal of the direct-current power supply 511 is connected to the first electrode 21 via the filter 53*f* and the switch 53*s*. The negative terminal of the direct-current power supply 512 is connected to the negative terminal of the direct-current power supply 511. The positive terminal of the direct-current power supply 512 is connected to the second electrode 22 via the filter 54*f* and the switch 54*s*. In the embodiment shown in FIG. 5 as well, the potential of the first electrode 21 becomes the negative potential. Further, the potential of the second electrode 22 may be the negative potential. The potential of the second electrode 22 is set to the potential higher than the potential of the first electrode 21.

The embodiment shown in FIG. 5 is common to the embodiment shown in FIG. 4 in that the direct-current power supply 511 and the direct-current power supply 512 are used. However, in the embodiment shown in FIG. 4, a high-voltage power supply may need to be used as each of the direct-current power supply 511 and the direct-current power supply 512. On the other hand, in the embodiment shown in FIG. 5, even when a relatively low-voltage power supply is used as the direct-current power supply 512, the potential difference between the first electrode 21 and the second electrode 22 can be appropriately set.

Figure 6A:
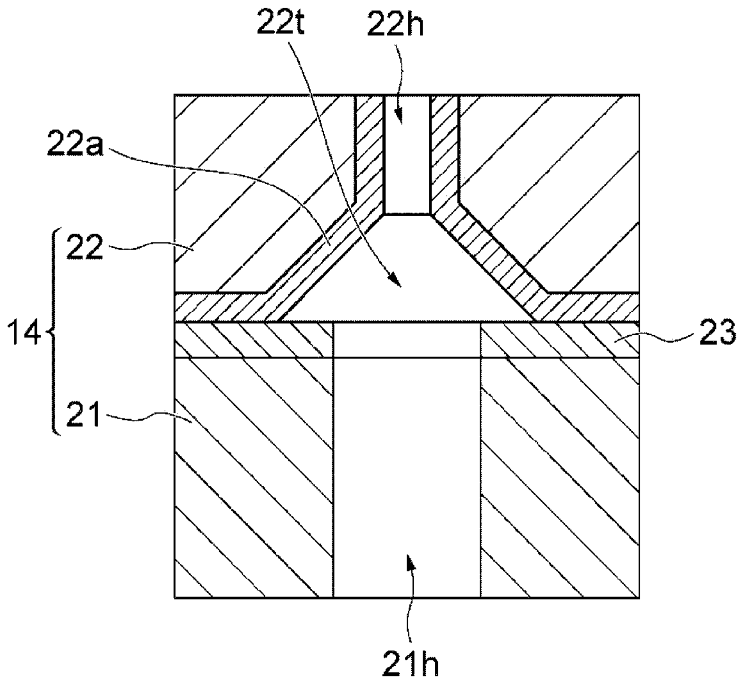
FIG. 6A is a partially enlarged cross-sectional view of the upper electrode adopted in the plasma processing apparatus according to still another exemplary embodiment.
Figure 6B:
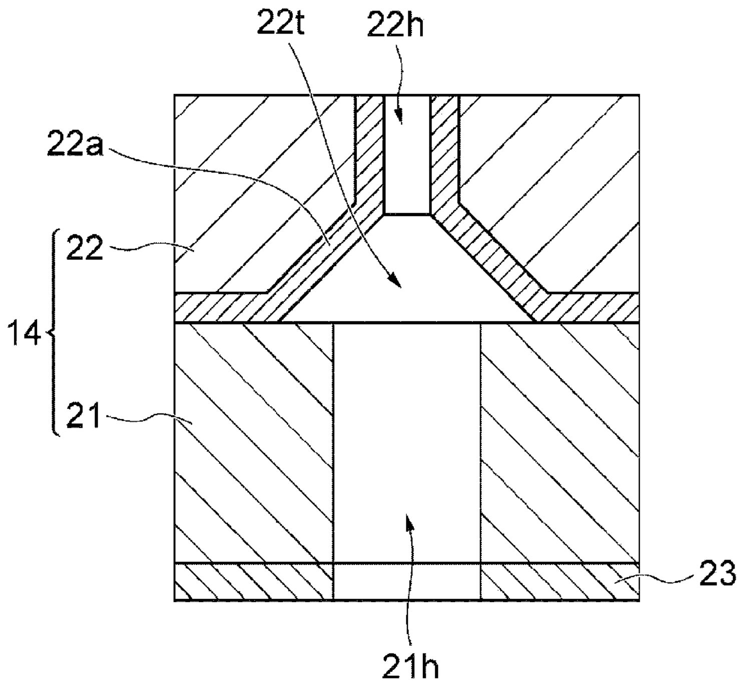
FIG. 6B is a partially enlarged cross-sectional view of the upper electrode adopted in the plasma processing apparatus according to still another exemplary embodiment.

Hereinafter, reference will be made to FIGS. 6A and 6B. Each of FIGS. 6A and 6B is partially enlarged cross-sectional view of the upper electrode adopted in the plasma processing apparatus according to still another exemplary embodiment. As shown in FIGS. 6A and 6B, the upper electrode 14 may further include a dielectric layer 23. The dielectric layer 23 is made of silicon, silicon carbide, or aluminum oxide.

As shown in FIG. 6A, the dielectric layer 23 is provided between the first electrode 21 and the second electrode 22. The dielectric layer 23 may be formed by thermal spraying on an upper surface of the first electrode 21 or a lower surface of the second electrode 22. Alternatively, the dielectric layer 23 may be a plate formed of a dielectric and may be sandwiched between the upper surface of the first electrode 21 and the lower surface of the second electrode 22.

As shown in FIG. 6B, the dielectric layer 23 may be formed on the lower surface of the first electrode 21. The dielectric layer 23 may be formed on the lower surface of the first electrode 21 by thermal spraying. Alternatively, the dielectric layer 23 may be a plate formed of the dielectric and may be fixed to the lower surface of the first electrode 21. The dielectric layer 23 may be formed on the upper surface of the second electrode 22.

Figure 7:
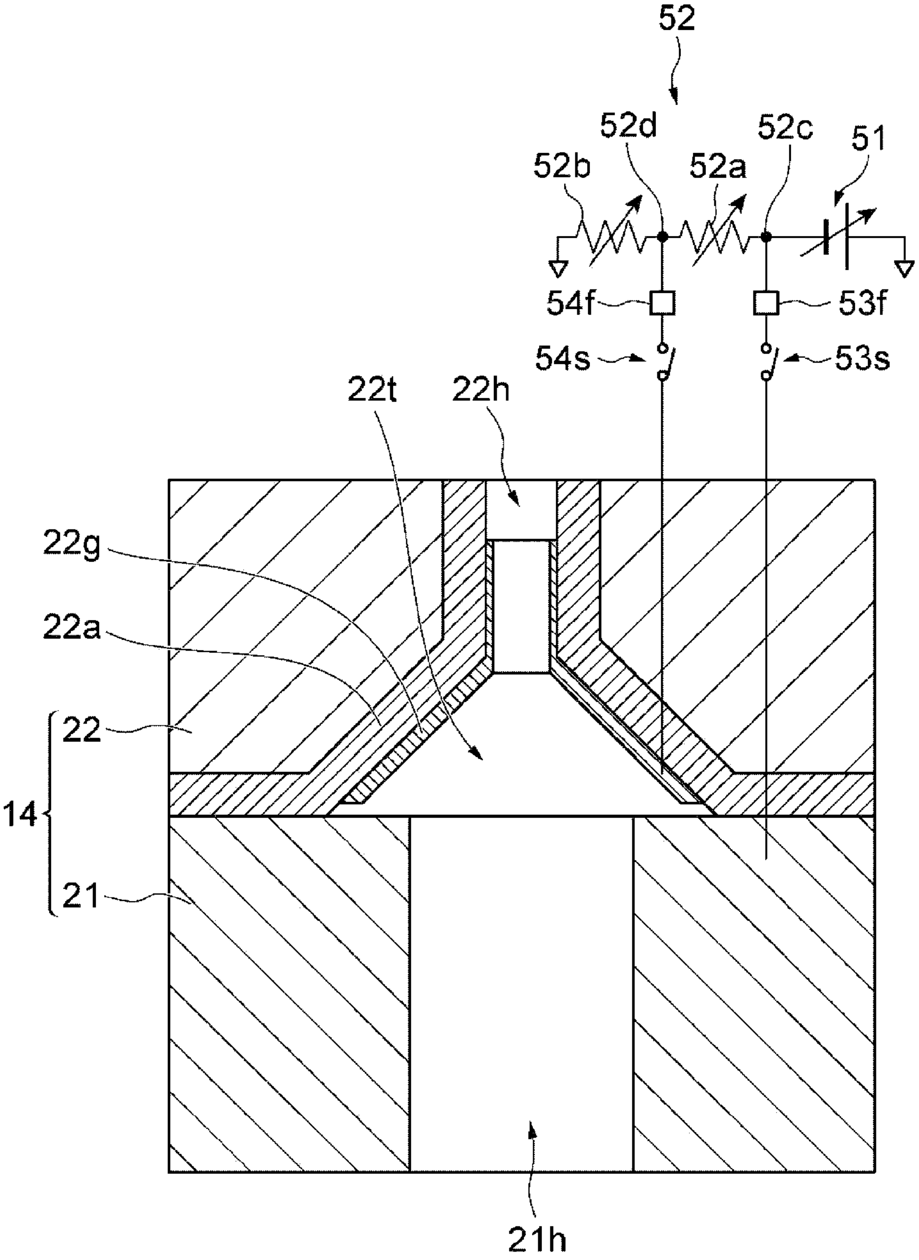
FIG. 7 is a partially enlarged cross-sectional view of the upper electrode adopted in the plasma processing apparatus according to still another exemplary embodiment.

FIG. 7 is a schematic diagram of a plasma processing apparatus according to still another exemplary embodiment. FIG. 7 is a partially enlarged cross-sectional view of the upper electrode adopted in the plasma processing apparatus according to still another exemplary embodiment. As shown in FIG. 7, the upper electrode 14 may further have a conductive layer 22*g*. The conductive layer 22*g* is formed in a surface region defining the end portion 22*t* of each of the plurality of second gas holes 22*h*. The conductive layer 22*g* is formed of a conductive material. The conductive layer 22*g* is made of, for example, silicon, silicon carbide, aluminum, or titanium.

The at least one power supply may apply a voltage to the conductive layer 22*g* to set the potential of the second electrode 22 described above. In the example shown in FIG. 7, the node 52*d* is connected to the conductive layer 22*g* via the filter 54*f* and the switch 54*s*. When the direct-current power supply 511 and the direct-current power supply 512 are used as shown in FIG. 4, the negative terminal of the direct-current power supply 512 is connected to the conductive layer 22*g* via the filter 54*f* and the switch 54*s*. When the direct-current power supply 511 and the direct-current power supply 512 are used as shown in FIG. 5, the positive terminal of the direct-current power supply 512 is connected to the conductive layer 22*g* via the filter 54*f* and the switch 54*s*.

In the embodiment shown in FIG. 7 as well, the resistor 52*a* may be the fixed resistor or the variable resistor. In the embodiment shown in FIG. 7 as well, the resistor 52*b* may be the fixed resistor or the variable resistor.

Figure 8:
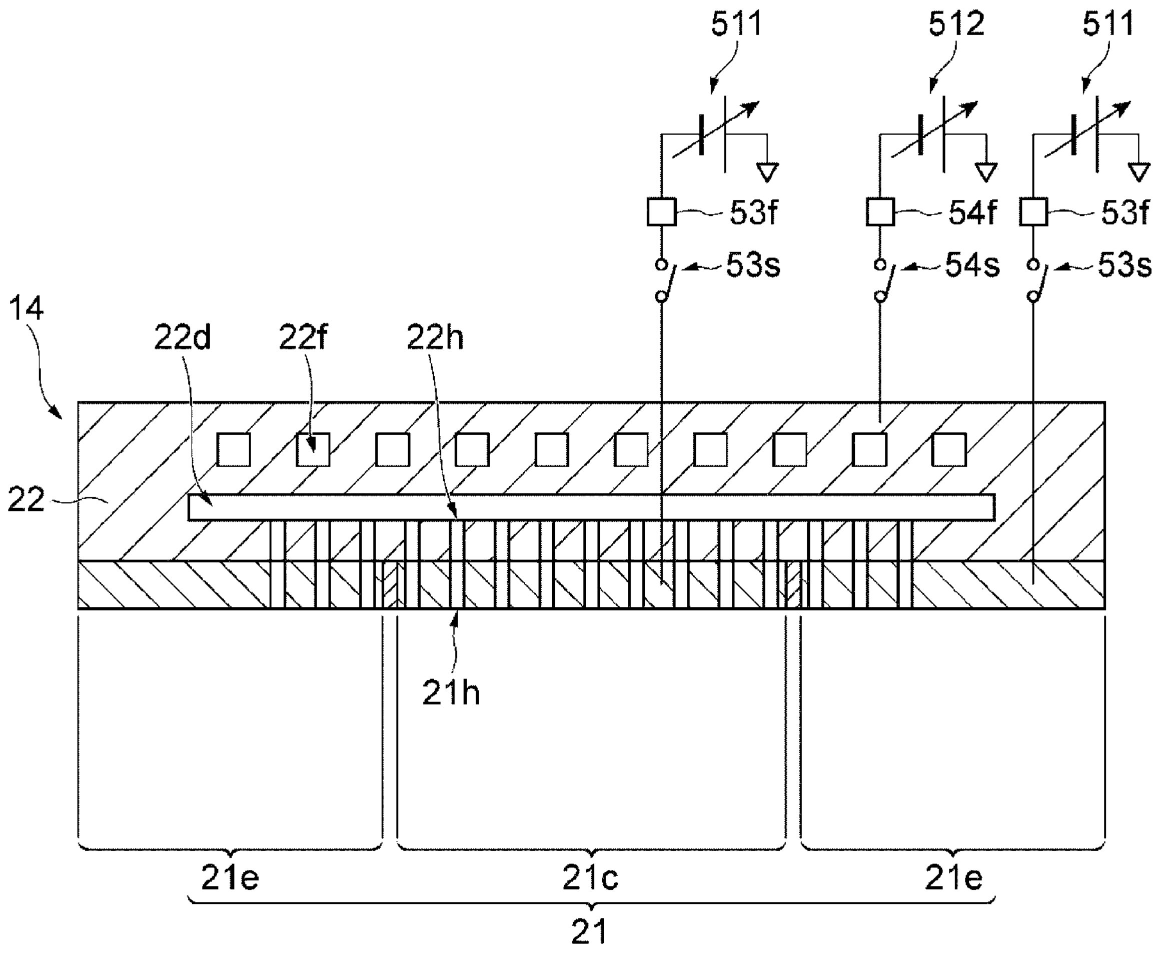
FIG. 8 is a cross-sectional view of the upper electrode adopted in the plasma processing apparatus according to still another exemplary embodiment.
Figure 9:
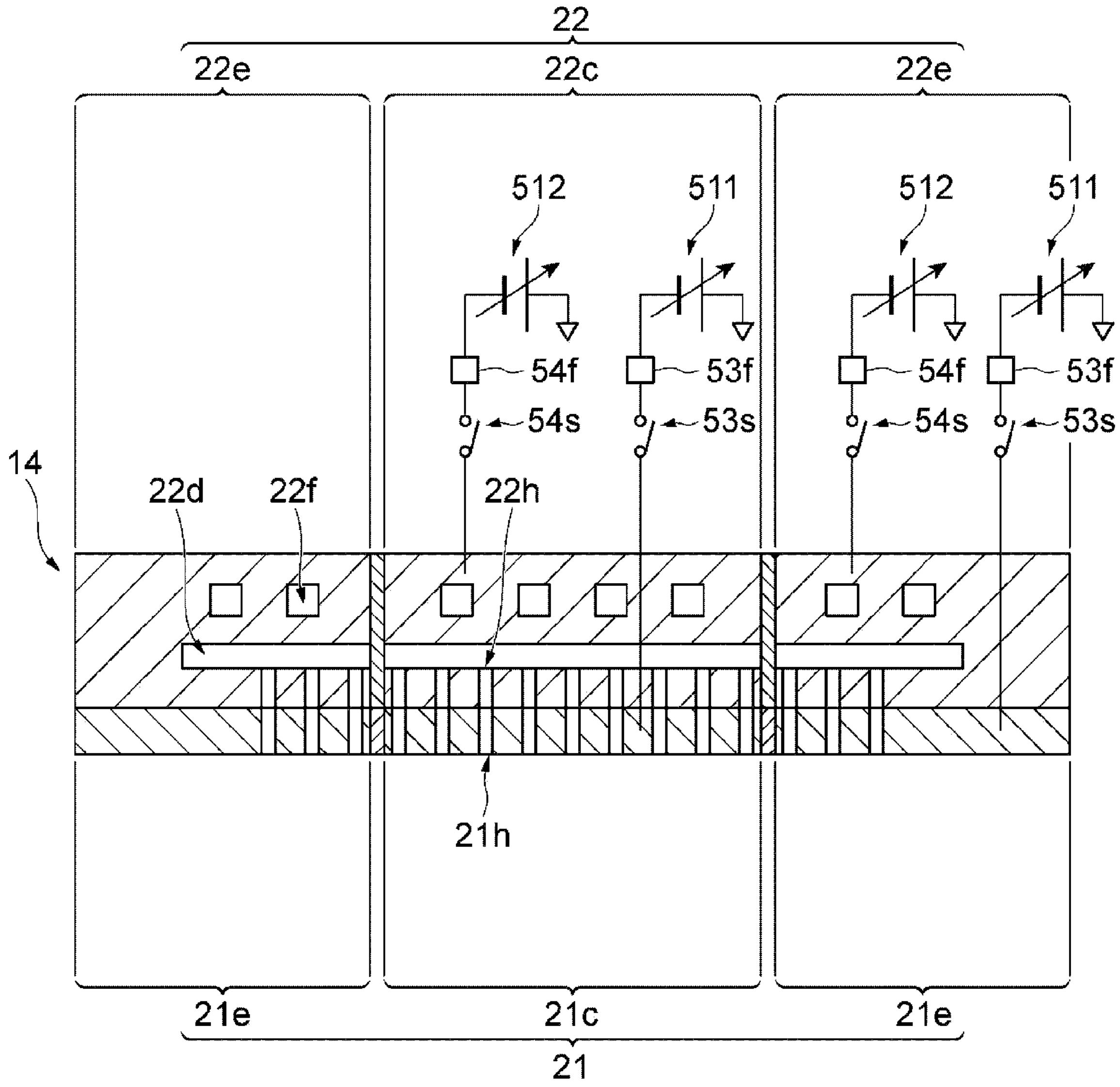
FIG. 9 is a cross-sectional view of the upper electrode adopted in the plasma processing apparatus according to still another exemplary embodiment.
Figure 10:
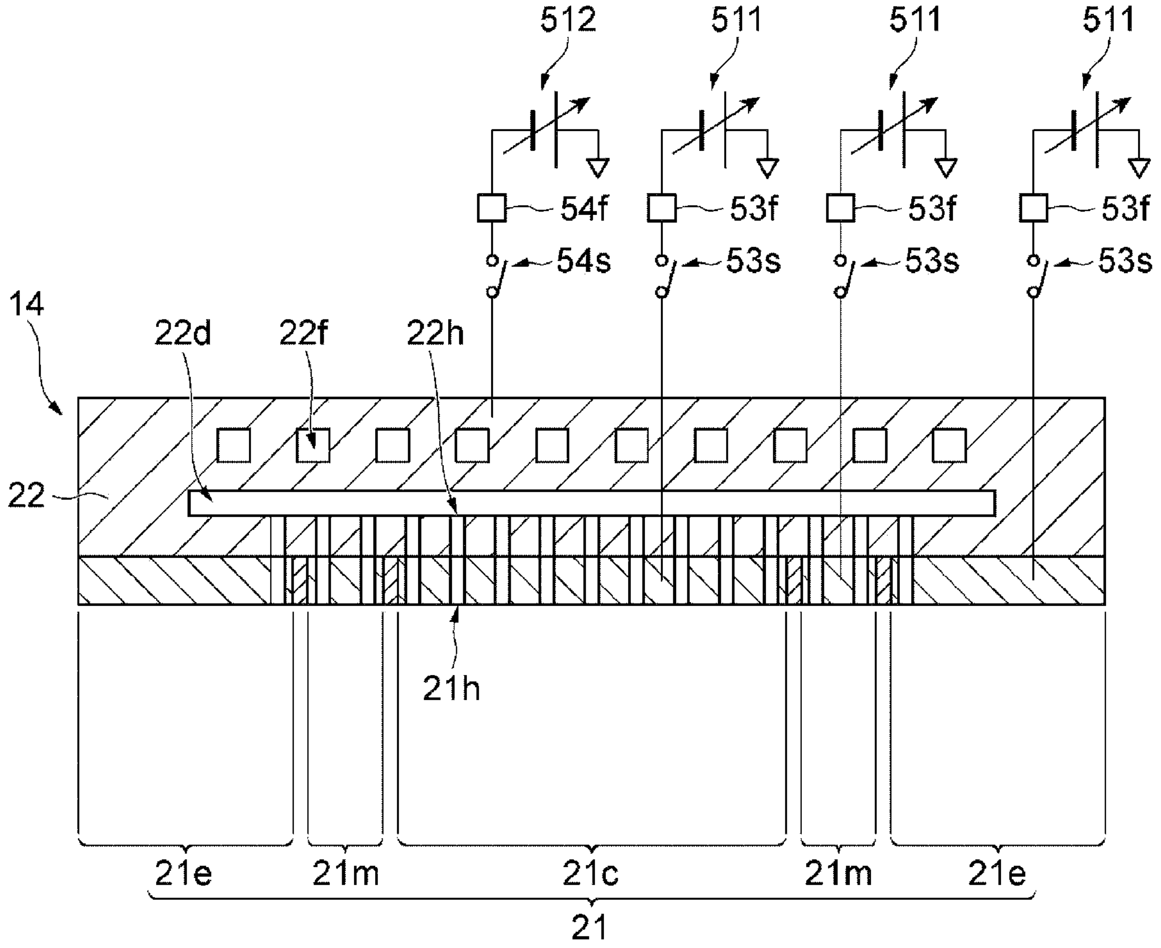
FIG. 10 is a cross-sectional view of the upper electrode adopted in the plasma processing apparatus according to still another exemplary embodiment.

Hereinafter, FIGS. 8 to 10 will be referred to. FIGS. 8 to 10 are cross-sectional views of the upper electrode adopted in the plasma processing apparatus according to still another exemplary embodiment. In the upper electrode 14 adopted in the plasma processing apparatus 1, the first electrode 21 or both the first electrode 21 and the second electrode 22 may be separated into a plurality of portions in a radial direction and/or a circumferential direction.

In the embodiment shown in FIG. 8, the first electrode 21 includes a portion 21*c* and a portion 21*e*. The portions 21*c* and 21*e* are separated from each other. The portion 21*c* configures a central region of the first electrode 21 in the radial direction. The portion 21*c* is a circular region in a plan view. The portion 21*e* is a region outside the portion 21*c* in the radial direction and constitutes a peripheral region of the first electrode 21. The portion 21*e* is an annular region in a plan view. A space may be provided between the portion 21*c* and the portion 21*e*, and an insulator material may be provided between the portion 21*c* and the portion 21*e*.

In the embodiment shown in FIG. 8, the direct-current power supply 511 is electrically connected to each of the portions 21*c* and 21*e* via the filter 53*f* and the switch 53*s*. The direct-current power supply 512 is electrically connected to the second electrode 22 via the filter 54*f* and the switch 54*s*.

In the embodiment shown in FIG. 9, the first electrode 21 includes the portion 21*c* and the portion 21*e*, as in the embodiment shown in FIG. 8. In the embodiment shown in FIG. 9, the second electrode 22 includes a portion 22*c* and a portion 22*e*. The portions 22*c* and 22*e* are separated from each other. The portions 22*c* configures a central region of the second electrode 22 in the radial direction. The portion 22*c* is a circular region in a plan view. The portions 22*c* is provided on the portion 21*c*. The portion 22*e* is a region outside the portion 22*c* in the radial direction and constitutes a peripheral region of the second electrode 22. The portion 22*e* is an annular region in a plan view. The portion 22*e* is provided on the portion 21*e*. A space may be provided between the portion 22*c* and the portion 22*e*, and an insulator material may be provided between the portion 22*c* and the portion 22*e*.

In the embodiment shown in FIG. 9, the direct-current power supply 511 is electrically connected to each of the portions 21*c* and 21*e* via the filter 53*f* and the switch 53*s*. The direct-current power supply 512 is electrically connected to each of the portions 22*c* and 22*e* via the filter 54*f* and the switch 54*s*.

In the embodiment shown in FIG. 10, the first electrode 21 includes a portion 21*m* in addition to the portions 21*c* and 21*e*. The portions 21*c*, 21*m*, and 21*e* are separated from each other. The portion 21*m* is a region between the portions 21*c* and 21*e*. The portion 21*m* is an annular region in a plan view. A space may be provided between the portions 21*c* and 21*m*, and an insulator material may be provided between the portions 21*c* and 21*m*. A space may be provided between the portions 21*m* and 21*e*, and an insulator material may be provided between the portions 21*m* and 21*e*.

In the embodiment shown in FIG. 10, the direct-current power supply 511 is electrically connected to each of the portions 21*c*, 21*m*, and 21*e* via the filter 53*f* and the switch 53*s*. The direct-current power supply 512 is electrically connected to the second electrode 22 via the filter 54*f* and the switch 54*s*.

Hereinafter, FIGS. 11 to 14 will be referred to. FIGS. 11 to 14 are exemplary timing charts. FIGS. 11 to 14 are timing charts of the potential of the bias electrode of the substrate support 12, the potential of the plasma generated in the chamber 10, and the potential of each of the first electrode and the second electrode of the upper electrode.

As shown in FIGS. 11 to 14, the waveform cycle CY includes periods P1 and P2. The period P1 is a negative phase period in the waveform cycle CY. The potential of the substrate W or the potential of the bias electrode in the period P1 is lower than an average potential of the substrate W or an average potential of the bias electrode in the waveform cycle CY. In the period P1, the potential of the substrate W or the potential of the bias electrode may be the negative potential. The period P2 is a period other than the period P1 in the waveform cycle CY and is a positive phase period in the waveform cycle CY. In the period P2, the potential of the substrate W or the potential of the bias electrode may be 0 V or more.

As shown in FIGS. 11 to 14, the at least one power supply of the plasma processing apparatus 1, that is, the direct-current power supply 51 or the direct-current power supplies 511 and 512 may set the potential of the first electrode 21 to be constant, like a potential V21A. Further, the at least one power supply of the plasma processing apparatus 1 may set the potential of the second electrode 22 to be constant, like a potential V22A.

Alternatively, as shown in FIGS. 11 to 14, the at least one power supply of the plasma processing apparatus 1, that is, the direct-current power supply 51 or the direct-current power supplies 511 and 512 may change the potential of the first electrode 21 in synchronization with the electric bias energy BE, like a potential V21B or V21C. Further, the at least one power supply of the plasma processing apparatus 1 may change the potential of the second electrode 22 in synchronization with the electric bias energy BE, like a potential V22B or V22C.

Specifically, the at least one power supply of the plasma processing apparatus 1 may set the potential of the first electrode 21 in the period P2 to a potential higher on the positive side than the negative potential of the first electrode 21 in the period P1 like the potential V21B or V21C. Further, the at least one power supply of the plasma processing apparatus 1 may set the potential of the second electrode 22 in the period P2 to a potential higher on the positive side than the negative potential of the second electrode 22 in the period P1, like the potential V22B or V22C. In this case, it is possible to reduce the potential difference between the plasma and the upper electrode 14 in the period P2. As a result, it is possible to reduce a speed of the ion from the plasma toward the upper electrode 14 and thus suppress the generation of the secondary electron.

Further, the at least one power supply of the plasma processing apparatus 1 may set an absolute value of the negative potential of the first electrode 21 in the period P1 to a value larger than an absolute value of the potential of the first electrode 21 in the period P2, like the potential V21B or V21C. Further, the at least one power supply of the plasma processing apparatus 1 may set an absolute value of the negative potential of the second electrode 22 in the period P1 to a value larger than an absolute value of the potential of the second electrode 22 in the period P2, like the potential V22B or V22C. In this case, even when the ion collides with the substrate W in the period P1 and the secondary electron is emitted from the substrate W, a speed of the secondary electrons toward the upper electrode 14 is reduced.

As shown in FIGS. 11 to 14, the potential of each of the first electrode 21 and the second electrode 22 in the waveform cycle CY may have potentials in two periods (potentials in periods P1 and P2), that is, two values. In another example, the number of periods in the waveform cycle CY may be another number other than two. Further, the potentials of the first electrode 21 and the second electrode 22 in the waveform cycle CY may change smoothly.

Figure 15A:
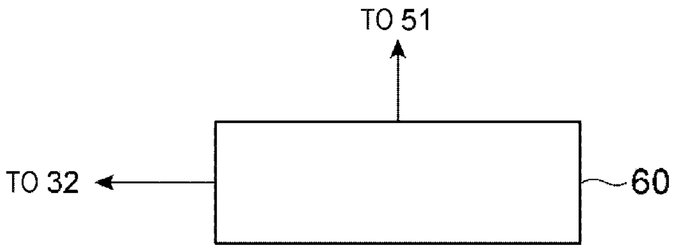
FIG. 15A is a diagram showing an exemplary configuration relating to control of a power supply.
Figure 15B:
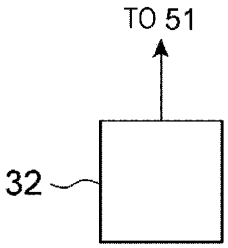
FIG. 15B is a diagram showing an exemplary configuration relating to the control of the power supply.

FIGS. 15A and 15B are diagrams showing exemplary configurations relating to control of the power supply. As shown in FIG. 15A, the plasma processing apparatus 1 may further include a power supply controller 60 to change the potential of the first electrode 21 and the potential of the second electrode 22 in synchronization with the electric bias energy BE. The power supply controller 60 provides a synchronization signal to the bias power supply 32 and the direct-current power supply 51. The power supply controller 60 further provides a phase signal to the direct-current power supply 51. The bias power supply 32 generates the electric bias energy BE in synchronization with the provided synchronization signal. The direct-current power supply 51 changes the potential of the first electrode 21 and the potential of the second electrode 22 in synchronization with the provided synchronization signal and in response to the phase signal. A waveform of an output voltage in the waveform cycle CY of the direct-current power supply 51 may be set in advance or may be set based on recipe data. Alternatively, as shown in FIG. 15B, the bias power supply 32 may generate the synchronization signal and the phase signal and provide the signals to the direct-current power supply 51.

Figure 16A:
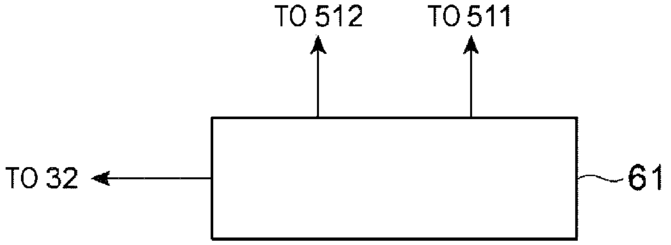
FIG. 16A is a diagram showing an exemplary configuration relating to control of a power supply.
Figure 16B:
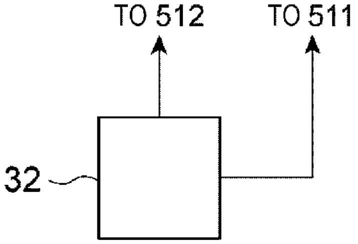
FIG. 16B is a diagram showing an exemplary configuration relating to the control of the power supply.

FIGS. 16A and 16B are diagrams showing exemplary configurations relating to control of the power supply. As shown in FIG. 16A, the plasma processing apparatus 1 may further include a power supply controller 61 to change the potential of the first electrode 21 and the potential of the second electrode 22 in synchronization with the electric bias energy BE. The power supply controller 61 provides the synchronization signal to the bias power supply 32, the direct-current power supply 511, and the direct-current power supply 512. The power supply controller 61 further provides the phase signal to direct-current power supply 511 and direct-current power supply 512. The bias power supply 32 generates the electric bias energy BE in synchronization with the provided synchronization signal. Each of the direct-current power supply 511 and the direct-current power supply 512 changes the potential of the first electrode 21 and the potential of the second electrode 22 in synchronization with the provided synchronization signal and in response to the phase signal. A waveform of an output voltage in the waveform cycle CY of each of the direct-current power supply 511 and the direct-current power supply 512 may be set in advance or may be set based on recipe data. Alternatively, as shown in FIG. 16B, the bias power supply 32 may generate the synchronization signal and the phase signal and provide the signals to the direct-current power supply 511 and the direct-current power supply 512.

While various exemplary embodiments have been described above, various additions, omissions, substitutions and changes may be made without being limited to the exemplary embodiments described above. Indeed, the embodiments described herein may be embodied in a variety of other forms.

For example, at least one of the plurality of second gas holes 22*h* or each of the plurality of second gas holes 22*h* may communicate with two or more first gas holes 21*h* among the plurality of first gas holes 21*h*. Further, each of the plurality of first gas holes 21*h* may be bent.

Hereinafter, various exemplary embodiments included in the present disclosure will be described in [E1] to [E16].

[E1]

A plasma processing apparatus including:
- a chamber that provides a processing space therein;
- a substrate support provided in the chamber;
- an upper electrode that configures a shower head that introduces a gas into the processing space from above the processing space, the upper electrode including a first electrode that provides a plurality of first gas holes opened toward the processing space and a second electrode provided directly or indirectly on the first electrode and configured to provide a plurality of second gas holes communicating with the plurality of first gas holes; and
- at least one power supply configured to set a potential of the second electrode to a potential higher than a potential of the first electrode.

In the embodiment [E1], the shower head provides a plurality of gas holes. Each of the plurality of gas holes includes one of the plurality of first gas holes and a second gas hole communicating therewith. In the embodiment [E1], even when positive ions enter the plurality of gas holes from the plasma in the processing space and collide with the second electrode and thus secondary electrons are emitted from the second electrode, the secondary electrons are immediately attracted to the second electrode. Therefore, dissociation of the gas in the plurality of gas holes by the colliding of the secondary electrons with the gas in the plurality of gas holes is suppressed.

[E2]

The plasma processing apparatus according to E1, in which the potential of the second electrode is higher than the potential of the first electrode by +5 V or more.

[E3]

The plasma processing apparatus according to [E1] or [E2], in which the at least one power supply is configured to set the potential of the first electrode to a negative potential, 0 V, or floating.

[E4]

The plasma processing apparatus according to any one of [E1] to [E3], in which a single power supply is provided as the at least one power supply,
- the plasma processing apparatus further includes a resistance dividing circuit connected to the single power supply, and
- two nodes having different potentials in the resistance dividing circuit are electrically connected to the first electrode and the second electrode, respectively.

[E5]

The plasma processing apparatus according to any one of [E1] to [E3], in which a first power supply electrically connected to the first electrode and a second power supply different from the first power supply and electrically connected to the second electrode are provided as the at least one power supply.

[E6]

The plasma processing apparatus according to any one of [E1] to [E5], further including a dielectric layer provided between the first electrode and the second electrode.

[E7]

The plasma processing apparatus according to any one of [E1] to [E6], in which the second electrode has a conductive layer in a surface region defining an end portion of each of the plurality of second gas holes on a side of the first electrode, and
- the at least one power supply is configured to apply a voltage to the conductive layer.

[E8]

The plasma processing apparatus according to any one of [E1] to [E6], in which the first electrode includes a plurality of portions separated from each other, and
- the at least one power supply is configured to apply a voltage to the plurality of portions.

[E9]

The plasma processing apparatus according to [E8], in which the plurality of portions of the first electrode are separated from each other in a radial direction.

[E10]

The plasma processing apparatus according to any one of [E1] to [E9], in which the second electrode has a temperature control mechanism.

[E11]

The plasma processing apparatus according to [E10], in which the temperature control mechanism is a flow path formed in the second electrode and a heat medium flows through the flow path.

[E12]

The plasma processing apparatus according to any one of [E1] to [E11], in which an end portion of each of the plurality of second gas holes on a side of the first electrode is tapered, and
- a diameter of an opening of the end portion of each of the plurality of second gas holes is larger than a diameter of each of the plurality of first gas holes.

[E13]

The plasma processing apparatus according to any one of [E1] to [E12], in which the first electrode is made of silicon, silicon carbide, or quartz, and the second electrode is made of metal or silicon carbide.

[E14]

The plasma processing apparatus according to any one of [E1] to [E13], in which electric bias energy having a waveform cycle is configured to be periodically supplied to the substrate support, the waveform cycle includes a negative phase period in which a potential of a substrate is lower than an average potential of the substrate in the waveform cycle and a positive phase period which is a period other than the negative phase period in the waveform cycle, and the at least one power supply is configured to set the potential of the first electrode in the positive phase period to a potential higher on a positive side than a negative potential of the first electrode in the negative phase period.

[E15]

The plasma processing apparatus according to any one of [E1] to [E13], in which electric bias energy having a waveform cycle is configured to be periodically supplied to the substrate support, the waveform cycle includes a negative phase period in which a potential of a substrate is lower than an average potential of the substrate in the waveform cycle and a positive phase period which is a period other than the negative phase period in the waveform cycle, and the at least one power supply is configured to set an absolute value of a negative potential of the first electrode in the negative phase period to a value larger than an absolute value of the potential of the first electrode in the positive phase period.

[E16]

The plasma processing apparatus according to [E14] or [E15], in which the electric bias energy is bias radio-frequency power or a pulse of a voltage periodically generated in a time interval of the waveform cycle.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A plasma processing apparatus comprising:

a chamber that provides a processing space therein;

a substrate support provided in the chamber;

an upper electrode that configures a shower head that introduces a gas into the processing space from above the processing space, the upper electrode including a first electrode that provides a plurality of first gas holes opened toward the processing space and a second electrode provided directly or indirectly on the first electrode and includes a plurality of second gas holes communicating with the plurality of first gas holes;

at least one power supply configured to supply power to the first electrode and to the second electrode; a bias power supply; and a controller including a processor and memory, the controller being configured to:

control the at least one power supply to set a potential of the second electrode to a potential higher than a potential of the first electrode, wherein the potential of the second electrode is higher than the potential of the first electrode by +5 V or more, control the bias power supply to periodically supply electric bias energy to the substrate support, the electric bias energy having a waveform cycle including:

a negative phase period in which a potential of a substrate is lower than an average potential of the substrate in the waveform cycle, and a positive phase period which is a period other than the negative phase period in the waveform cycle, and control the at least one power supply to set the potential of the first electrode in the positive phase period to a potential higher on a positive side than a negative potential of the first electrode in the negative phase period.

2. The plasma processing apparatus according to claim 1, wherein the at least one power supply is configured to set the potential of the first electrode to a negative potential, 0 V, or floating.

3. The plasma processing apparatus according to claim 1, comprising a single power supply as the at least one power supply, and further comprising a resistance dividing circuit connected to the single power supply, wherein two nodes having different potentials in the resistance dividing circuit are electrically connected to the first electrode and the second electrode, respectively.

4. The plasma processing apparatus according to claim 1, comprising:

a first power supply electrically connected to the first electrode; and a second power supply different from the first power supply and electrically connected to the second electrode, wherein the first and the second power supplies are provided as the at least one power supply.

5. The plasma processing apparatus of claim 1, further comprising:

a dielectric layer provided between the first electrode and the second electrode.

6. The plasma processing apparatus according to claim 1, wherein the second electrode has a conductive layer in a surface region defining an end portion of each of the plurality of second gas holes on a side of the first electrode, and the at least one power supply is configured to apply a voltage to the conductive layer.

7. The plasma processing apparatus according to claim 1, wherein the first electrode includes a plurality of portions separated from each other, and the at least one power supply is configured to apply a voltage to the plurality of portions.

8. The plasma processing apparatus according to claim 7, wherein the plurality of portions of the first electrode are separated from each other in a radial direction.

9. The plasma processing apparatus according to claim 1, wherein the second electrode has a temperature control mechanism.

10. The plasma processing apparatus according to claim 9, wherein the temperature control mechanism is a flow path formed in the second electrode and a heat medium flows through the flow path.

11. The plasma processing apparatus according to claim 1, wherein an end portion of each of the plurality of second gas holes on a side of the first electrode is tapered, and a diameter of an opening of the end portion of each of the plurality of second gas holes is larger than a diameter of each of the plurality of first gas holes.

12. The plasma processing apparatus according to claim 1, wherein the first electrode is made of silicon, silicon carbide, or quartz, and the second electrode is made of metal or silicon carbide.

13. The plasma processing apparatus according to claim 1, wherein the at least one power supply is configured to set an absolute value of a negative potential of the first electrode in the negative phase period to a value larger than an absolute value of the potential of the first electrode in the positive phase period.

14. The plasma processing apparatus of claim 13, wherein the electric bias energy is bias radio-frequency power or a pulse of a voltage periodically generated in a time interval of the waveform cycle.

* * * * *